US008410685B2

(12) United States Patent
Ota

(10) Patent No.: US 8,410,685 B2
(45) Date of Patent: Apr. 2, 2013

(54) ORGANIC ELECTROLUMINESCENT PANEL, ORGANIC ELECTROLUMINESCENT DISPLAY, ORGANIC ELECTROLUMINESCENT LIGHTING DEVICE, AND PRODUCTION METHODS THEREOF

(75) Inventor: Yoshifumi Ota, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 65 days.

(21) Appl. No.: 13/059,519

(22) PCT Filed: May 25, 2009

(86) PCT No.: PCT/JP2009/059523
§ 371 (c)(1),
(2), (4) Date: Feb. 17, 2011

(87) PCT Pub. No.: WO2010/024006
PCT Pub. Date: Mar. 4, 2010

(65) Prior Publication Data
US 2011/0133637 A1  Jun. 9, 2011

(30) Foreign Application Priority Data
Sep. 1, 2008 (JP) ................. 2008-223240

(51) Int. Cl.
*H01J 1/62* (2006.01)
*C09K 11/00* (2006.01)

(52) U.S. Cl. .......... 313/504; 313/506; 313/512; 445/24; 445/25

(58) Field of Classification Search ........... 313/498–512
See application file for complete search history.

(56) References Cited

U.S. PATENT DOCUMENTS

| 5,445,898 | A | 8/1995 | Budzilek et al. |
| 5,445,899 | A | 8/1995 | Budzilek et al. |
| 6,239,453 | B1 | 5/2001 | Yamada et al. |
| 8,084,938 | B2 * | 12/2011 | Ota ............................. 313/504 |
| 2001/0000335 | A1 | 4/2001 | Yamada et al. |
| 2003/0071570 | A1 | 4/2003 | Tamashiro et al. |
| 2003/0151107 | A1 | 8/2003 | Yamada et al. |
| 2004/0004434 | A1 | 1/2004 | Nishi et al. |
| 2005/0140291 | A1 | 6/2005 | Hirakata et al. |

(Continued)

FOREIGN PATENT DOCUMENTS

| JP | 2003-178866 | 6/2003 |
| JP | 2005-209631 A | 8/2005 |

(Continued)

OTHER PUBLICATIONS

International Search Report for PCT/JP2009/059523, mailed Jun. 16, 2009.

*Primary Examiner* — Tracie Y Green
(74) *Attorney, Agent, or Firm* — Nixon & Vanderhye P.C.

(57) ABSTRACT

The present invention provides an organic EL panel, an organic EL display, and an organic EL lighting device, which are capable of simultaneously producing a plurality of organic EL panels with a narrow frame region and high reliability, and also provides production methods thereof. The organic electroluminescent panel of the present invention comprises: an element substrate in which an organic electroluminescent element and a terminal region are formed; a sealing member that covers the organic electroluminescent element; a sealing substrate attached to the element substrate with the sealing member interposed therebetween; and a first spacer disposed only in a region between the organic electroluminescent element and the terminal region.

31 Claims, 6 Drawing Sheets

U.S. PATENT DOCUMENTS

| | | |
|---|---|---|
| 2006/0135029 A1* | 6/2006 | Harada .......................... 445/25 |
| 2008/0030128 A1 | 2/2008 | Kim |
| 2008/0050585 A1* | 2/2008 | Masuda et al. ................ 428/354 |
| 2008/0074042 A1* | 3/2008 | Itai ................................ 313/504 |
| 2009/0026946 A1* | 1/2009 | Satake .......................... 313/512 |
| 2010/0090596 A1 | 4/2010 | Ota |
| 2010/0320484 A1 | 12/2010 | Hirakata et al. |

FOREIGN PATENT DOCUMENTS

| | | |
|---|---|---|
| JP | 2006-179352 | 7/2006 |
| JP | 2006-286412 | 10/2006 |
| JP | 2007-329448 | 12/2007 |
| RU | 2 131 174 | 5/1994 |
| RU | 2 152 106 | 5/1997 |
| WO | WO 2008/078648 | 7/2008 |

* cited by examiner (a)

(b)

(c)

(d)

(a)

(b)

(c)

ORGANIC ELECTROLUMINESCENT PANEL, ORGANIC ELECTROLUMINESCENT DISPLAY, ORGANIC ELECTROLUMINESCENT LIGHTING DEVICE, AND PRODUCTION METHODS THEREOF

This application is the U.S. national phase of International Application No. PCT/JP2009/059523 filed 25 May 2009, which designated the U.S. and claims priority to JP Application No. 2008-223240 filed 1 Sep. 2008, the entire contents of each of which are hereby incorporated by reference.

TECHNICAL FIELD

The present invention relates to an organic electroluminescent (hereinafter, also referred to as an organic EL) panel, an organic EL display, an organic EL lighting device, and production methods thereof. More particularly, the present invention relates to an organic EL panel that can be preferably used in an organic EL display or an organic EL lighting device, and to an organic EL display, an organic EL lighting device, and production methods thereof.

BACKGROUND ART

According to a conventional organic EL panel, deterioration of an organic EL element because of exposure of the organic EL element to oxygen, moisture, and the like is prevented by the following sealing can structure commonly used: a desiccant is attached to a sealing can (concave glass can) and a sealing resin is disposed into a frame shape outside the outer periphery of an organic EL element. However, it is difficult to provide the organic EL panel having this sealing can structure with a top-emission structure because in the top-emission structure, light is outputted from an upper surface of the panel (i.e., an increase in aperture ratio is difficult), and further, a reduction in thickness of the panel is also difficult. Hence, research and development on a sealing structure where a flat substrate is used (hereinafter, also referred to as a "flat sealing structure" are now being made.

According to this flat sealing structure, it is necessary to form a film of an adhesive free from air bubbles into a specific pattern between the substrates. Organic EL panels having such a flat sealing structure have been disclosed as follows. According to the following organic EL panel having a flat sealing structure (see Patent Document 1, for example), a protective barrier (sealing material) is disposed on an attachment surface of a sealing substrate to intercept a emission area and its peripheral electrode region of a panel substrate, and an uncured sealing resin (filler) is applied on the inner side of the protective barrier on an attachment surface of the panel substrate, and the panel substrate is attached to the sealing substrate with the protective barrier and the cured sealing resin. According to the organic EL panel of Patent Document 1, an uncured sealing resin applied to a emission area cannot be dispersed on an electrode region side by a protective barrier formed around the emission area, and can be cured in the later step and thereby formed in each emission area Patent Document 2, for example, discloses an organic EL panel that can maintain stable light-emission characteristics for a long period of time by sealing a space between an element substrate and a sealing substrate with a sheet sealing member that covers an organic EL element, and a liquid sealing member disposed around the sheet sealing member. Further, according to the following sealing process aiming at simplification of steps (see Patent Document 3, for example), only a solid sealing resin instead of the liquid sealing resin (filler), which needs the protective barrier (sealing material), is used to cover each light-emitting region on a panel substrate.

[Patent Document 1]
    Japanese Kokai Publication No. 2003-178866
[Patent Document 2]
    WO 2008/078648
[Patent Document 3]
    Japanese Kokai Publication No. 2006-179352

SUMMARY OF THE INVENTION

The technique of Patent Document 1 requires a region for disposing a protective barrier, and the technique of Patent Document 2 requires a region for disposing a liquid sealing member. Accordingly, the techniques of Patent Documents 1 and 2 have room for improvement in terms of a large frame region and a large panel contour. In contrast, the technique of Patent Document 3 realizes a narrower frame region compared with the techniques of Patent Documents 1 and 2 because sealing is performed only with a solid sealing resin in the technique of Patent Document 3. However, in the technique of Patent Document 3, a solid sealing resin is peeled in the division step in producing multiple substrates for a plurality of organic EL panels, and the airtightness of an organic EL element forming region may not be securable. In this case, the organic. EL panel of Patent Document 3 has a room for improvement it that the organic EL element is degraded by exposure to moisture and oxygen, leading to the reduction in reliability of the organic EL panel. Accordingly, still required is a technique for simultaneously producing a plurality of organic EL panels with a narrow frame region and high reliability.

The present invention has been made in view of the above-mentioned state of the art. The present invention has an object to provide an organic EL panel, an organic EL display, and an organic EL lighting device, which are capable of simultaneously producing a plurality of organic EL panels with a narrow frame region and high reliability, and also to provide production methods thereof.

DISCLOSURE OF THE INVENTION

The present inventors made various investigations on the organic EL panel capable of simultaneously producing a plurality of organic EL panels with a narrow frame region and high reliability, and focused on a spacer for maintaining a predetermined distance (pitch) between an element substrate and a sealing substrate. The present inventors have found that when the spacer is disposed only in a region between the organic EL element and a terminal region, peeling of a sealing member can be prevented while the increase in the frame region is suppressed. As a result, the present invention is arrived at on the basis of these findings, which allow solving brilliantly the above-mentioned problems.

That is, the present invention relates to an organic electroluminescent panel, comprising: an element substrate in which an organic electroluminescent element and a terminal region are formed; a sealing member that covers the organic electroluminescent element; a sealing substrate attached to the element substrate with the sealing member interposed therebetween; and a first spacer disposed only in a region between the organic electroluminescent element and the terminal region.

According to the organic EL panel of the present invention, the first spacer can prevent deformation of the organic EL panel due to external stress in the division step, such as stress concentration and change in environmental temperature, and prevent peeling of the sealing member. As a result, the reduction in airtightness of the sealing member caused by peeling thereof can be suppressed. According to the first spacer, the material of the sealing member can be cured while a uniform distance between the element substrate and the sealing substrate is maintained uniformly. Therefore, the thickness of the sealing member can be strictly controlled. As a result, the coatability of irregularities of the drawing wiring connected to the organic EL element with the sealing member can be improved, and the reduction in airtightness of the sealing member resulting from the irregularities of the drawing wiring can be suppressed. Thus, the reliability of the organic EL panel can be enhanced.

According to the organic EL panel of the present invention, the first spacer disposed only in the region between the organic EL element and the terminal region can suppress the increase in the frame region of the organic EL panel. Thus, when the first spacer is disposed on an inner side of the terminal region (on an organic EL element side) so as not to surround the organic EL element, the number of organic EL panels obtained by dividing a combination of an element mother substrate and a sealing mother substrate can be increased. Accordingly, the organic EL panel of the present invention can be particularly suitably used in the embodiment in which the combination of the element mother substrate and the sealing mother substrate are divided to produce a plurality of organic EL panels.

Further, use of the organic EL of the present invention no longer needs a spacer to be contained in the sealing member, and therefore can easily realize the organic EL panel having a top-emission structure in which light is emitted from the sealing substrate side. In addition, the organic EL element is less likely to be directly damaged by external pressing or the like.

The number of the organic EL elements covered with the sealing member is not particularly limited, and may be singular or plural. The terminal region is a region in which a terminal for mounting electronic parts is disposed, and a mounting pad (connection electrode) is generally disposed thereon.

In the present description, the region between the organic EL element and the terminal region contains not only the region sandwiched by the organic EL element and the terminal region but also the region that extends the region sandwiched by the organic EL element and the terminal region to the end of the substrate.

The organic EL panel of the present invention has a flat sealing structure, and so, unlike the organic EL panel having a sealing can structure including a sealing can and the like, the organic EL panel of the present invention can be thinned and further increase an aperture ratio if it has a top-emission structure. The organic EL element has a structure in which at least an organic light-emitting layer is interposed between an anode and a cathode. The order in which the organic light-emitting layer, the anode, and the cathode are stacked is not especially limited, and either the anode or the cathode may be disposed on the element substrate side. If the top-emission structure is applied to the organic EL panel, a reflective electrode is disposed in the element substrate, and a transparent electrode is disposed in the sealing substrate.

The configuration of the organic EL panel of the present invention is not especially limited as long as it essentially includes such components. The organic EL panel may or may not include other components.

Preferable embodiments of the organic EL panel of the present invention are mentioned in more detail below. The following embodiments may be employed in combination.

It is preferable that the sealing substrate is not overlapped with the terminal region. This facilitates the mounting of electronic parts on the terminal region. In the case of dividing the combination of the element mother substrate and the sealing mother substrate to produce a plurality of organic EL panels, it is necessary to divide the sealing mother substrate in the region between the organic EL element and the terminal region and divide the element mother substrate opposite to the organic EL element with the terminal region interposed therebetween in order to produce an organic EL panel having a configuration in which the sealing substrate is not overlapped with the terminal region. Upon dividing the sealing mother substrate and the element mother substrate, the stress concentration deforms the sealing mother substrate and the element mother substrate, and the sealing member is more likely to be peeled. In the organic EL panel of the present invention, the first spacer prevents deformation of the sealing mother substrate and the element mother substrate caused by the stress concentration upon dividing the attached element substrate and sealing mother substrate, and therefore peeling of the sealing member can be prevented. Thus, the organic EL panel of the present invention is particularly suitably used for the embodiment in which the combination of the element mother substrate and the sealing mother substrate is divided to produce a plurality of organic EL panels.

In the present description, the region opposite to the organic EL element with the terminal region interposed therebetween contains not only the region opposite to the organic EL element with the terminal region interposed therebetween but also the region that extends the region opposite to the organic EL element with the terminal region interposed therebetween to the end of the substrate.

It is preferable that the first spacer is disposed away from the sealing member. As a result, a space is provided between the first spacer and the sealing member. Accordingly, even if the organic EL panel is deformed by the stress concentration upon dividing the attached element substrate and sealing substrate, the space can be used as a buffer, and peeling of the sealing member can be prevented. The space can be used also as a buffer to prevent deformation of the organic EL panel due to external stress such as change in environmental temperature. Thus, the reliability of the organic EL panel can be enhanced.

The first spacer may be disposed independently, preferably with an organic material, and more preferably with resin. As a result, the first spacer can be easily disposed in the desired position with a coating device such as a dispenser. The first spacer may include what is called column spacers, but preferably includes spherical spacers. According to this, the first spacer can be uniformly dispersed in an organic material and resin. Thus, it is preferable that the first spacer includes spherical spacers dispersed in resin. The average particle diameter of the spherical spacers is preferably 1 to 100 μm. If it is less than 1 μm, the uniform dispersibility of the spherical spacers and the uniformity of the particle diameter are deteriorated, and thereby the substrate distance (distance between the element substrate and the sealing substrate) may vary. When it exceeds 100 μm, the panel thickness may be too large. The average particle diameter of the spherical spacers is more preferably 20 μm or less in consideration of the sealing performance and light transmittance.

Examples of the resin for dispersing the spherical spacers include epoxy resins (EP), methacrylic resins (poly(meth)acrylate), cyclic polyolefin (COP) resins, vinyl chloride resins (polyvinyl chloride, PVC), polyethylene terephthalate (PET) resins, various nylons (polyamide resins), polyimide (PI) resins, polyamide-imide (PAI) resins, polyarylphthalate resins, silicone resins, polysulfone (PS) resins, polyphenylene sulfide (PPS) resins, polyether sulphone (PES) resins, polyurethane (PU) resins, and acetal resins (polyacetal, POM). Among these, the resin is particularly preferably a photocurable resin. According to this, heating for curing resin can be omitted, and so the reduction in yield, due to misalignment and the like, can be suppressed. Further, the absence of the heating leads to an improvement in reliability of the organic EL element because the organic EL element is vulnerable to heat. In addition, the takt time for curing resin can be shortened compared with the time for curing resin by heating. The resins exemplified as the material for dispersing the spherical spacers also have the specific structure, or may be a derivative thereof and the like.

The above-mentioned photocurable resin generally includes a photopolymerization initiator together with a photopolymerizable monomer and the like. For example, a photocationic polymerization initiator initiates a polymerization reaction of an epoxy resin, and a photoradical polymerization initiator and the like initiate a polymerization reaction of an acrylic resin. The amount of the photopolymerization initiator included in the photocurable resin largely depends on a material to be selected as the photopolymerizable monomer. If it is too small, the reaction might proceed insufficiently or too slowly. If it is too large, the reaction proceeds so quickly, which possibly results in a reduction in workability, heterogeneous reaction, and the like. The UV-curable resin among the above-mentioned photocurable resins is cured only by exposure to UV irradiation, and so, it is excellent in workability. A UV-curable resin is advantageous in that environment under which the UV-curable resin is applied is hardly limited. Accordingly, the above resin is preferably a UV-curable resin.

The material for the sealing member is not especially limited. An organic material is preferable and a resin is more preferable. Examples of the resin include epoxy resins (EP), methacrylic resins (poly(meth)acrylate), cyclic polyolefin (COP) resins, vinyl chloride resins (polyvinyl chloride, PVC), polyethylene terephthalate (PET) resins, various nylons (polyamide resins), polyimide (PI) resins, polyamide-imide (PAI) resins, polyaryl phthalate resins, silicone resins, polysulfone (PS) resins, polyphenylene sulfide (PPS) resins, polyether sulphone (PES) resins, polyurethane (PU) resins, and acetal resins (polyacetal, POM). Among these, the resin is particularly preferably a thermocurable resin. That is, the sealing member preferably includes and more preferably consists of a thermocurable resin. If the sealing material is cured by photopolymerization, the entire surface of the organic EL element is irradiated with, for example, UV rays. In such a case, deterioration of the organic EL element is concerned. Accordingly, it is preferable that the sealing member is thermally polymerized in order to prevent the deterioration of the organic EL element. The resins exemplified as the material for the sealing member also have the specific structure, or may be a derivative thereof and the like.

It is preferable that the sealing member has a thickness of 1 to 100 μm. If the sealing member has a thickness of less than 1 μm, the gap between the substrates varies even if the first spacer is used. So, it might be difficult to uniform the thickness of the second sealing member. If the sealing member has a thickness of more than 100 μm, the light transmittance of the sealing member is decreased. So if the organic EL panel including the sealing member having a thickness of more than 100 μm has a top-emission structure, the amount of light outputted from the organic EL element might be decreased. The thickness of the sealing member used herein is an average thickness of the sealing member. The upper limit of the thickness of the sealing member is more preferably 20 μm.

It is preferable that the sealing member has a light transmittance of 80% or more in the visible wavelength range. Such a configuration is preferably applied to the organic EL panel of the present invention if the organic EL panel includes an organic EL element having a top-emission structure, which can provide a high aperture ratio. The "visible wavelength range" used herein is a wavelength range of 380 to 780 nm. The "light transmittance in the visible wavelength range" is a transmittance for visible light at 380 to 780 nm, measured with a spectrophotometer (trade name: U-4000, product of Hitachi, Ltd.) in accordance with JIS R 3106 "Testing method on transmittance of flat glasses".

It is preferable that a difference in linear expansion coefficient (coefficient of linear expansion) between the first spacer and the sealing member is as small as possible. It is preferable that a difference in linear expansion coefficient between the first spacer and the sealing member is preferably $1.0 \times 10^{-4}$ $(K^{-1})$ or less. A common sealing resin has a linear expansion coefficient (coefficient of linear expansion) of $2.0 \times 10^{-5}$ to $9.0 \times 10^{-5}$ $(K^{-1})$. According to this embodiment, the first spacer and the sealing member have almost the same linear expansion coefficient. In such an embodiment, even if a temperature is sharply changed or a local external force is applied to the organic EL panel, the sealing member can follow the volume change of the first spacer. As a result, separation of the sealing member from the substrates can be prevented, and generation of the gap between the sealing member and the element substrate or the sealing member and the sealing substrate can be prevented. The difference in linear expansion coefficient between the first spacer, the sealing member, and the resin with the first spacer dispersed therein is preferably $1.0 \times 10^{-4}$ $(K^{-1})$ or less from the same viewpoint. The difference in linear expansion coefficient between the first spacer, the sealing member, and the photocurable resin with the first spacer dispersed therein is preferably $1.0 \times 10^{-4}$ $(K^{-1})$ or less.

It is preferable that a difference in linear expansion coefficient is as small as possible among materials for the first spacer, the sealing member, the element substrate, the sealing substrate, and the sealing member. It is preferable that a difference in linear expansion coefficient between the first spacer, the sealing member, the element substrate, and the sealing substrate is $1.0 \times 10^{-4}$ $(K^{-1})$ or less. As a result, the space that is formed by separation of the sealing member from the substrates is hardly generated. The difference in linear expansion coefficient between the first spacer, the sealing member, the element substrate, the sealing substrate, and the resin with the first spacer dispersed therein is preferably $1.0 \times 10^{-4}$ $(K^{-1})$ or less from the same viewpoint. The difference in linear expansion coefficient between the first spacer, the sealing member, the sealing substrate, and the photocurable resin with the first spacer dispersed therein is preferably $1.0 \times 10^{-4}$ $(K^{-1})$ or less. In general, what is called a flexible substrate such as a plastic substrate has a larger linear expansion coefficient than that of a glass substrate, and further an amount of deformation caused by temperature changes or external force of the flexible substrate is also larger than that of the glass substrate. For example, a glass substrate (trade name: 1737, product of Corning Incorporation) has a linear expansion coefficient of $3.8 \times 10^{-6}$ $(K^{-1})$, and a polyether sulfone (PES) resin substrate (trade name: SUMILITE FS-5300, product of SUMITOMO BAKELITE Co., Ltd.) has a linear expansion coefficient of $5.4 \times 10^{-5}$ $(K^{-1})$. So if a flexible substrate is used as the element substrate and the sealing substrate, the substrates and the sealing members have almost the same linear expansion coefficient. As a method of measuring the linear expansion coefficient, a method of using a push rod dilatometer and a photo-interference method, and the like, are mentioned. As an embodiment in which the difference in linear expansion coefficient between the material for the element substrate and that for the sealing substrate is small, for example, an embodiment in which the same material is used for the element substrate and the sealing substrate.

The organic electroluminescent panel may comprise a second spacer disposed only in a region opposite to the terminal region with the organic electroluminescent element interposed therebetween. As a result, deformation of the organic EL panel caused by external stress such as change in environmental temperature can be more prevented, and peeling of the sealing member can be more prevented. Accordingly, the reduction in airtightness of the sealing member can be more suppressed. In addition, the distance between the element substrate and the sealing substrate can be kept more uniformly, and the thickness of the sealing member can be controlled more strictly. As a result, the coatability of irregularities of the drawing wiring connected to the organic EL element with the sealing member can be improved, and the reduction in airtightness of the sealing member resulting from the irregularities of the drawing wiring can be more suppressed. Thus, the reliability of the organic EL panel can be enhanced.

In the present description, the region opposite to the terminal region with the organic EL element interposed therebetween contains not only the region opposite to the terminal region with the organic EL element interposed therebetween but also the region that extends the region opposite to the terminal region with the organic EL element interposed therebetween to the end of the substrate.

The embodiment described as a favorable embodiment of the first spacer can be applied to a favorable embodiment of the second spacer for the same reason as in the first spacer. That is, the second spacer is preferably disposed far from the sealing member. In addition, the second spacer preferably comprises spherical spacers dispersed in resin (more preferably photocurable resin). The difference in linear expansion coefficient between the first spacer, the second spacer, and the sealing member is preferably $1.0 \times 10^{-4}$ $(K^{-1})$ or less. The difference in linear expansion coefficient between the first spacer, the second spacer, the sealing member, the element substrate, and the sealing substrate is preferably $1.0 \times 10^{-4}$ $(K^{-1})$ or less. The difference in linear expansion coefficient between the first spacer, the second spacer, the sealing member, the element substrate, the sealing substrate, the resin with the first spacer dispersed therein, and the resin with the second spacer dispersed therein is preferably $1.0 \times 10^{-4}$ $(K^{-1})$ or less. The difference in linear expansion coefficient between the first spacer, the second spacer, the sealing member, the element substrate, the sealing substrate, the photocurable resin with the first spacer dispersed therein, and the photocurable resin with the second spacer dispersed therein is preferably $1.0 \times 10^{-4}$ $(K^{-1})$ or less.

It is preferable that the first spacer and the second spacer are made of the same material. As a result, the first spacer and the second spacer can be formed in the same process, and the steps can be simplified.

It is preferable that the organic electroluminescent panel has a top-emission structure. The top-emission structure is preferably used for increases in aperture ratio because light emitted by the organic EL element can be outputted without passing through the element substrate in which a circuit for driving the organic EL element is disposed. The organic EL panel of the present invention provided with the first spacer does not need to contain a spacer in the sealing member and therefore can easily achieve the top-emission structure. According to the embodiment in which the organic EL panel has a top-emission structure, it is preferable in view of high aperture ratio that each of the sealing member and the sealing substrate has a light transmittance of 80% or more in the visible wavelength range.

The present invention is also an organic electroluminescent display or an organic electroluminescent lighting device each including the organic electroluminescent panel. Such organic EL display and organic EL lighting device each can exhibit stable light-emission characteristics for a long period of time, attributed to the organic EL panel.

The organic electroluminescent display and the organic electroluminescent lighting device of the present invention are not especially limited as long as each includes the above-mentioned organic EL panel as a component. The organic EL display and the organic EL lighting device may or may not include other components. As a preferable embodiment of the organic EL display and the organic EL lighting device of the present invention, an embodiment in which each includes the above-mentioned organic EL panel and a driver IC is mentioned. The driver IC is not especially limited as long as it is a circuit or IC for driving the organic EL panel. A scanning driver IC, a signal driver IC, and the like, are mentioned as the driver IC.

The present invention further relates to a production method of an organic electroluminescent panel by using an element mother substrate provided with a plurality of panel regions in each of which an organic electroluminescent element and a terminal region are formed, the method comprising the steps of: disposing a sheet sealing member so as not to cover the terminal region and so as to cover the organic electroluminescent element; disposing a spacer at least in a region between the organic electroluminescent element and the terminal region; attaching the element mother substrate and a sealing mother substrate; and dividing the element mother substrate and the sealing mother substrate together with the sheet sealing member at the same cutting position.

According to the production method of the organic EL panel of the present invention, deformation of the organic EL panel caused by external stress such as change in environmental temperature can be prevented by spacers, and peeling of the sheet sealing member can be prevented. As a result, a cured product of the sheet sealing member is peeled, and the reduction in airtightness of the sheet sealing member can be suppressed. The sheet sealing member can be cured while the distance between the element mother substrate and the sealing mother substrate is kept uniform, and therefore the thickness of the cured product of the sheet sealing member can be strictly controlled. As a result, the coatability of irregularities of the drawing wiring connected to the organic EL element with the sealing member can be improved, and the reduction in airtightness of the sealing member resulting from the irregularities of the drawing wiring can be suppressed. Thus, the reliability of the organic EL panel can be enhanced.

According to the production method of the organic EL panel of the present invention, the element mother substrate and the sealing mother substrate are divided together with the sheet sealing member at the same cutting position. Thereby, the element mother substrate and the sealing mother substrate can be divided so that the organic EL panel contains necessary spacers. As a result, the increase in the frame region of the organic EL panel can be suppressed. In addition, the sheet sealing member is superior in adhesion and barrier performance to the liquid sealing member. Accordingly, when the organic EL element is covered with the sheet sealing member, the adhesive strength after panel formation can be enhanced. Consequently, even if the element mother substrate and the sealing mother substrate are divided together with the sheet sealing member at the same cutting position, the mechanical strength of the organic EL panel can be sufficiently secured.

Further, according to the production method of the organic EL panel of the present invention, the sheet sealing material does not need to contain spacers. Accordingly, the organic EL panel having a top-emission structure can be easily produced. Due to use of the sheet sealing member for sealing the organic EL element, the takt time for arrangement of the sealing member can be significantly shortened compared with the case that the liquid sealing member is used.

It is preferable that the sheet sealing member-disposing step is performed in a vacuum or reduced pressure environment. If the sheet sealing member-disposing step is performed in an atmospheric environment, for example, under air, the sheet sealing member absorbs moisture and further, air and the like enter the sealed space. So, a step of removing the moisture from the sheet sealing member, or a step of performing degassing for a long time might need to be performed after the attachment step.

The term "reduced pressure" used herein means a state at a pressure of $10^{-6}$ to 10 Pa. The term "vacuum" used herein means a state at a pressure of less than $10^{-6}$ Pa.

The sheet sealing member has adhesive property. The sheet sealing member is disposed to cover the organic EL element and cured to attach (connect) the element substrate to the sealing substrate, thereby sealing the organic EL element. By using these properties of the sheet sealing material, the sealing mother substrate is attached to the element mother substrate. In addition, air can be prevented from entering the sealed space through the air hole by prevention of the following problems. The substrates and the like deform (sag, warp, etc.), for example, by being moved or by a change in environment from the vacuum or reduced pressure environment to the inert gas atmosphere. As a result, due to misalignment between the element mother substrate and the sealing mother substrate or stress concentration to the sheet sealing material, an air hole is formed at the part where the substrates are attached to each other with the sheet sealing material therebetween. The following embodiments are mentioned as an embodiment of the sheet sealing member, for example. (1) An embodiment in which the sheet sealing member itself has adhesive property; (2) an embodiment in which an adhesive component is applied on a surface of the sheet sealing member; and (3) an embodiment in which an adhesive component is solidified to give the sheet sealing member. A lamination method, a pressing method, and a roll-to-roll method are mentioned as the arrangement method of the sheet sealing member, for example. The sheet sealing member may be disposed on the element mother substrate or the sealing mother substrate before the attachment step as long as it is disposed not to cover the terminal region but to cover the organic EL element after the attachment step. It is preferable that the sheet sealing member is disposed on the sealing mother substrate prior to the attachment step in order to prevent the deterioration of the organic EL element.

The spacer may be disposed in either the element mother substrate or the sealing mother substrate before the attachment step as long as it is disposed at least between the organic EL element and the terminal region after the attachment step. The spacer is preferably disposed on the substrate (sealing mother substrate) on the side in which the organic EL element is not formed. The spacer may be disposed in the substrate on which the sheet sealing member is disposed or the substrate on which the sheet sealing member is not disposed before the attachment step as long as it is disposed at least between the organic EL element and the terminal region after the attachment step. The spacer is preferably disposed on the substrate on which the sheet sealing member is disposed. Thus, when the spacer and the sheet sealing member are disposed on the same substrate, it is needless to consider the misalignment in the attachment step, and the spacer and the sheet sealing member can be very precisely disposed on the substrate.

It is preferable that the attachment step is performed in the presence of an inert gas and in a vacuum or reduced pressure environment. According to this, it is possible to prevent deterioration of the organic EL element because the sheet sealing member before curing absorbs moisture, oxygen, and the like. It is preferable to perform the attachment step at a room temperature in order to ensure accuracy of alignment.

The production method of the organic EL panel of the present invention is not especially limited as long as it essentially includes the sheet sealing member-disposing step, the spacer-disposing step, the attachment step, and the division step. The production method may or may not include other steps. Which step is performed first, the sheet sealing member-disposing step or the spacer-disposing step, is not especially limited, for example. It is preferable that the sheet sealing member-disposing step is performed and then the spacer-disposing step is performed, in order to ensure accuracy of alignment of the element substrate and the sealing substrate.

Preferable embodiments of the production method of the organic EL panel of the present invention are mentioned in more detail below. The following embodiments may be employed in combination.

It is preferable that in order to easily mount electronic parts on the organic EL panel, the sealing substrate is not overlapped with the terminal region so as to facilitate the contact between the terminal region and the electronic parts. In order to carry out the embodiment in which the sealing substrate is not overlapped with the terminal region, in the division step, it is necessary to divide the sealing mother substrate in the region between the organic electroluminescent element and the terminal region and divide the element mother substrate in a region opposite to the organic electroluminescent element with the terminal region interposed therebetween. However, if the division step is performed under the above conditions, a cured product of the sheet sealing member is more likely to be peeled by stress concentration. According to the production method of the organic EL panel of the present invention, when the spacer is disposed in the region between the organic EL element and the terminal region, peeling of a cured product of the sheet sealing member can be prevented in the region between the organic EL element and the terminal region. Therefore, the production method is particularly effective in the embodiment of the division step under the above conditions. That is, it is preferable that in the division step, the sealing mother substrate is divided in the region between the organic EL element and the terminal region, and the element mother substrate is divided in the region opposite to the organic EL element with the terminal region interposed therebetween. It is to be noted that the same panel region contains "the terminal region" and "the organic EL element" in "the region opposite to the organic EL element with the terminal region interposed therebetween".

It is preferable that in the division step, the element mother substrate and the sealing mother substrate are divided so that the spacer remains only in a region between the organic electroluminescent element and the terminal region. When the spacer remains only in the region between the organic EL element and the terminal region, in which a cured product of the sheet sealing member is more likely to be peeled, peeling of the sheet sealing member can be prevented while the increase in the frame region can be suppressed, and the reliability of the organic EL panel can be enhanced.

In the division step, the element mother substrate and the sealing mother substrate may be divided so that the spacer remains only in the region between the organic electroluminescent element and the terminal region and in a region opposite to the terminal region with the organic electroluminescent element interposed therebetween. As a result, the effect of preventing peeling of the cured product of the sheet sealing member can be widely exerted, and the reliability of the organic EL panel can be enhanced.

It is preferable that in the sheet sealing member-disposing step, the sheet sealing member is disposed to continuously cover the organic electroluminescent elements adjacent to each other without the terminal region interposed therebetween. As a result, the takt time for disposing the sheet sealing member can be significantly shortened in comparison with the embodiment where a different sheet sealing member is disposed in each organic EL element.

It is preferable that in the sheet sealing member-disposing step, the sheet sealing member is disposed along the arrangement direction of the organic electroluminescent elements adjacent to each other without the terminal region interposed therebetween. As a result, the sheet sealing member can be easily disposed only in a necessary region, and the terminal region can be prevented from being covered with the sheet sealing member. In addition, plural lines of sheet sealing members can be simultaneously disposed, and therefore the takt time for disposing the sheet sealing members can be shortened.

It is preferable that in the spacer-disposing step, the spacer is disposed so as to surround a region in which the sheet sealing member is disposed. As a result, since the spacer is not disposed between the organic EL elements adjacent to each other without the terminal region interposed therebetween, the number of organic EL panels obtained by a combination of an element mother substrate and a sealing mother substrate can be increased.

It is preferable that in the spacer-disposing step, the spacer is disposed away from the sheet sealing member. As a result, since a space can be formed between the spacer and the sheet sealing member, this space can be used for buffering the stress concentration and external stress in the division step, peeling of the cured product of the sheet sealing member can be more prevented, and the reliability of the organic EL panel can be enhanced.

It is preferable that the spacer includes spherical spacers, and in the spacer-disposing step, a liquid sealing member with the spherical spacers dispersed therein is disposed so as to surround a region in which the sheet sealing member is disposed. In this case, the sheet sealing member and the organic EL element can be shielded from air with a cured product of the liquid sealing member, and therefore the sheet sealing member can be cured in air. In addition, by using the spherical spacers, the spacer can be uniformly dispersed in the liquid sealing member. Further, since the spacer is not disposed between organic EL elements adjacent to each other without the terminal region interposed therebetween, the number of organic EL panels obtained by a combination of an element mother substrate and a sealing mother substrate can be increased. Examples of the method of disposing the liquid sealing member with spherical spacers dispersed therein include: a method of ejecting the liquid sealing member with a dispenser; and screen printing. The step of disposing the liquid sealing member with spherical spacers dispersed therein is preferably carried out in a vacuum or reduced pressure environment for the same reason as in the sheet sealing member-disposing step. In the step of disposing the liquid sealing member with spherical spacers dispersed therein, the liquid sealing member may be disposed so as to surround the region in which the sheet sealing member is to be disposed, and thereafter the spherical spacers may be dispersed in the disposed liquid sealing member.

It is preferable that in the spacer-disposing step, the spherical spacers and the liquid sealing member are disposed away from the sheet sealing member. When the liquid sealing member is disposed in contact with the sheet sealing member, the liquid sealing member may proceed into and degrade the organic EL element. Accordingly, when the liquid sealing member is disposed far from the sheet sealing member, degradation of the organic EL element caused by the liquid sealing member can be prevented. When the liquid sealing member is disposed far from the sheet sealing member, a space can be formed in a region between the spherical spacers and the liquid sealing member and the sheet sealing member. Therefore, this space can be used for buffering the stress concentration and external stress in the division step, peeling of a cured product of the sheet sealing member can be prevented, and the reliability of the organic EL panel can be enhanced.

The liquid sealing member preferably includes and more preferably consists of a photocurable resin. According to this, the liquid sealing member can be cured without heat by photopolymerization through light irradiation, and so the reduction in yield, due to misalignment and the like, can be suppressed. Further, the absence of the heating leads to an improvement in reliability of the organic EL element because the organic EL element is vulnerable to heat. In addition, the takt time for curing the liquid sealing member can be shortened compared with the time for thermal curing.

It is preferable that in the production method of the organic electroluminescent panel further comprises the sheet sealing member is softened and then cured. Thus, the sheet sealing member is once softened and then cured, and thereby, the sheet sealing member more conforms to irregularities of the substrates. Accordingly, if the substrates (element substrates and/or sealing substrates) are deformed when the environment under which the element substrates and sealing substrates attached in the production method of the organic EL panel exist is changed from the vacuum or reduced pressure environment to air environment, the sheet sealing member can follow deformation of the substrates. So, generation and contamination of vacuum bubbles at the interface between the substrate and the sheet sealing member can be suppressed. In addition, the coatability of the irregularities of a drawing wiring with a sheet sealing member can be more improved. In this case, it is more preferable that the sheet sealing member has thermoplasticity (softens by heating). According to this, the sheet sealing member can be more easily softened by heating.

It is preferable that the sheet sealing member is cured by polymerization. Thus, molecules of a compound constituting the sheet sealing member are polymerized to cure the sheet sealing member, and thereby a moisture permeability of a cured product of the sheet sealing member can be reduced. As a result, the sealing performances of the cured product of the sheet sealing member can be more improved.

If the sheet sealing member is cured by thermopolymerization, misalignment between the substrates, attributed to heat distribution, might occur. In addition, the organic EL element is vulnerable to heat, and so its reliability might be, reduced. Further, the curing time for thermopolymerization (takt time for curing) might be longer than that for photopolymerization. It is preferable that the sheet sealing member is cured by photopolymerization in order to suppress the misalignment and the reduction in reliability, and to shorten the curing time.

If the sheet sealing member is cured by photopolymerization, the entire surface of the organic EL element is irradiated with UV rays and the like to polymerize molecules of a compound constituting the sheet sealing member. In such a case, deterioration of the organic EL element is concerned. Accordingly, in order to prevent the organic EL element from being deteriorated by photoirradiation, it is preferable that the sheet sealing member is cured by thermopolymerization.

That is, the following embodiments (1) and (2) are mentioned as more preferable embodiments of the production method of the organic EL panel of the present invention. (1) The liquid sealing member including a photocurable resin is cured by photopolymerization; and the sheet sealing member is softened by heating, and then cured by photopolymerization. (2) The liquid sealing member including a photocurable resin is cured by photopolymerization; and the sheet sealing member is cured by thermopolymerization.

According to the above-mentioned embodiment (1), the liquid sealing member is cured while the sheet sealing member is covered with a mask and the like so as not to be cured in the liquid sealing member-curing step. Further, in the sheet sealing member-curing step, the sheet sealing member is softened (for example, the substrates are heated, thereby getting the sheet sealing member to exhibit its thermoplasticity), and then, the sheet sealing member is cured by photoirradiation. According to such processes, the heating time is reduced, and therefore the takt time for curing the sheet sealing member can be shortened.

According to the above-mentioned embodiment (2), a liquid adhesive can be cured without covering the sheet sealing member with a mask and the like in the liquid sealing member-curing step. So, the steps can be simplified. According to this embodiment, a heating treatment is employed for thermally polymerizing the sheet sealing member. In such an embodiment, the liquid sealing member is cured and so the misalignment is not concerned. So the sheet sealing member can be cured for a longer heating time.

It is preferable that a cured product of the sheet sealing member has a light transmittance of 80% or more in the visible wavelength range. This embodiment is preferably applied to production of a top-emission organic EL element, in which a high aperture ratio can be obtained.

The present invention is also a production method of an organic electroluminescent display or a production method of an organic electroluminescent lighting device, each including the production method of the organic electroluminescent panel. According to the production method, an organic EL display device and an organic EL lighting device each including the organic EL element that can be produced through simple production steps at low costs and that can keep stable light-emission characteristics for a long period of time can be produced.

The technical idea of the present invention can be applied to various devices that include an element that is preferably shielded from air on a substrate, in addition to the organic EL panel. Such devices to which the technical idea is applied are as follows, for example: a microcapsule electrophoresis display; an electronic paper display (paper-like display) having polymer network liquid crystals and the like; a light-emitting diode (LED); a plasma display; an inorganic EL display; an electronic ink (E ink); and a solar cell.

The present invention provides an organic EL panel, an organic EL display, and an organic EL lighting device, which are capable of simultaneously producing a plurality of organic EL panels with a narrow frame region and high reliability, and also provides production methods thereof.

BRIEF DESCRIPTION OF THE DRAWINGS

FIG. 9 is a plan view schematically illustrating the vicinity of a terminal region of the organic EL panel with no spacer part 5a.

BEST MODES FOR CARRYING OUT THE INVENTION

The organic EL panel and the production method thereof are mentioned in more detail below with reference to Embodiments. However, the present invention is not limited to only these Embodiments.

Embodiment 1

Figure 1:
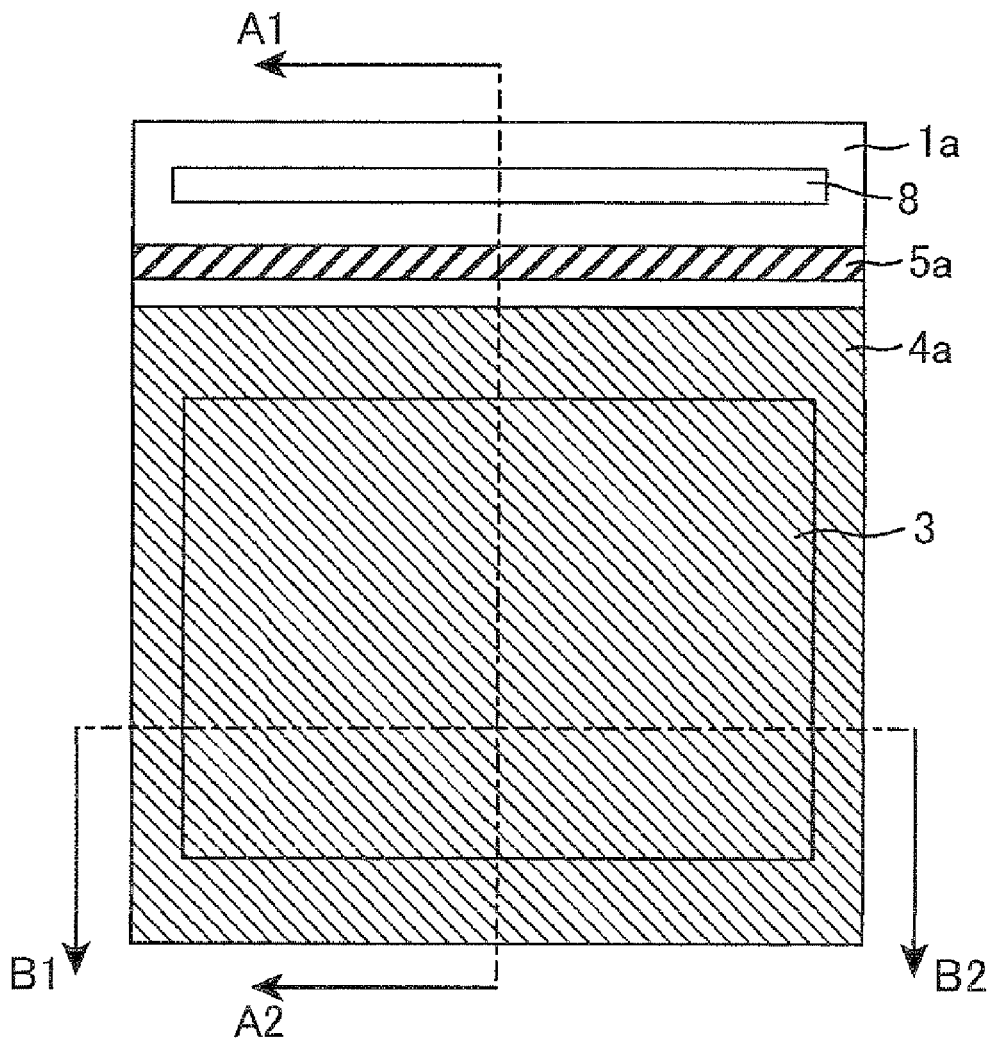
FIG. 1 is a plan view schematically illustrating an organic EL panel in accordance with Embodiment 1.
Figure 2:
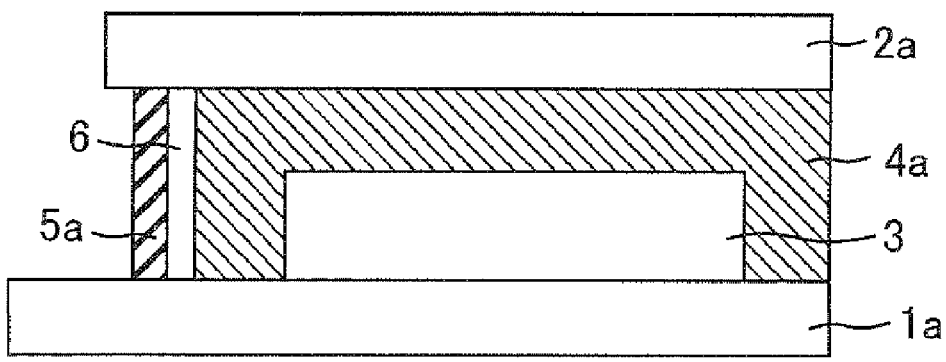
FIG. 2 is a schematic cross-sectional view taken along line A1-A2 in FIG. 1.
Figure 3:
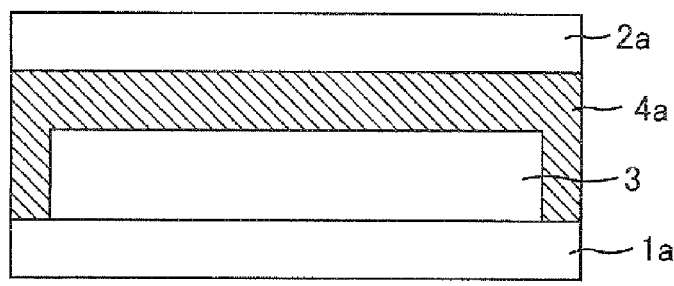
FIG. 3 is a schematic cross-sectional view taken along line B1-B2 in FIG. 1.

FIG. 1 is a plan view schematically illustrating an organic EL panel in accordance with Embodiment 1, FIG. 2 is a schematic cross-sectional view taken along line A1-A2 in FIG. 1, and FIG. 3 is a schematic cross-sectional view taken along line B1-B2 in FIG. 1.

As illustrated in FIGS. 1 to 3, the organic EL panel of Embodiment 1 comprises an element substrate 1a, a sealing substrate 2a, an element region 3, a terminal region 8, a spacer part 5a, and a sealing member 4a, and has a top-emission structure. The element substrate 1a is a plate-like substrate divided from an element mother substrate. The sealing substrate 2a is a plate-like substrate divided from a sealing mother substrate. In the element region 3, a plurality of organic EL elements is disposed arranged in a matrix in a plane. A mounting pad (connection electrode) is disposed in the terminal region 8. The spacer part 5a is disposed in a region between the element region 3 and the terminal region 8. The spacer part 3a functions as a first spacer. The sealing member 4a is disposed so as to cover the element region 3. As illustrated in FIG. 2, on the plane taken along line A1-A2 passing through the terminal region 8, the spacer part 5a is disposed far from the sealing member 4a, and a space 6 is formed between the spacer part 5a and the sealing member 4a. As illustrated in FIG. 3, at the end of the plane taken along line B1-B2, the sealing member 4a is disposed, and the spacer part 5a is not disposed. The element substrate 1a and the sealing substrate 2a are attached with the sealing member 4a and the spacer part 5a interposed therebetween. Thus, the organic EL panel of the present embodiment is formed.

According to the present embodiment, a glass substrate (trade name: 1737, thickness: 0.7 mm, linear expansion coefficient: $3.8 \times 10^{-6}$ ($K^{-1}$), product of Corning Incorporation) is used as the element mother substrate. The element mother substrate may not necessarily the glass substrate, and it may be a flexible substrate such as a substrate made of polyether sulfone (PES) resin (trade name: SUMILITE FS-5300, thickness: 0.2 mm, linear expansion coefficient: $5.4 \times 10^{-5}$ ($K^{-1}$), product of SUMITOMO BAKELITE Co., Ltd.). A glass substrate (trade name: 1737, thickness: 0.7 mm, linear expansion coefficient: $3.8 \times 10^{-6}$ ($K^{-1}$), product of Corning Incorporation) is used as the sealing mother substrate in the present embodiment. The sealing mother substrate may not be necessarily the glass substrate, either, and it may be a flexible substrate such as a substrate made of PES resin.

The organic EL element disposed in the element region 3 has a structure in which an organic layer containing at least a light-emitting layer is interposed between an anode and a cathode. Examples of the organic layer other than the light-emitting layer include an electron injection layer, an electron transport layer, a hole transport layer, and a hale injection layer. A drawing wiring used for driving the organic EL element, as well as the organic EL element, is disposed in the element region 3 on the element substrate 1a, and the organic EL element is electrically connected to the drawing wiring. In addition, a mounting pad disposed in the terminal region 8 is electrically connected to the organic EL element disposed in the element region 3 with the drawing wiring interposed therebetween.

The sealing member 4a is a cured product of the sheet sealing member. The sheet sealing member is a sealing member that can keep a predetermined shape and volume when disposed and has flexibility that can conform to irregularities of the organic EL element and drawing wiring when pressure is applied thereto. The thickness of the sheet sealing member is not particularly limited, and the sheet sealing member may be what is called a film sealing member. In the present embodiment, a thermocurable resin (linear expansion coefficient: $7 \times 10^{-5}$ ($K^{-1}$), light transmittance in a visible wavelength region after curing (the sealing member 4a): 95%) having thermoplasticity and mainly containing an epoxy resin (EP) is used as the sheet sealing member. The sealing member 4a is attached so as to cover the entire surface of the element region 3. In the case where the photocurable resin is used for the sheet sealing member, the organic EL element is also exposed to UV rays and the like, and therefore may be degraded. Accordingly, resins other than the epoxy resin may be used as the sheet sealing member, but a thermocurable resin having thermoplasticity is preferably used. The thermocurable resin having thermoplasticity is softened and can be deformed when heated. However, it is cured by a chemical reaction when the heating is continued. It is to be noted that a photocurable resin (linear expansion coefficient: $6 \times 10^{-5}$ ($K^{-1}$), light transmittance in a visible wavelength region after curing (the sealing member 4a): 97%) having thermoplasticity and mainly containing a methacrylic resin (poly(meth)acrylate) may be used as the sheet sealing member. The sheet sealing member may be provided with a drying function by addition of a desiccant.

The spacer part 5a is a cured product of a liquid sealing member with spherical spacers dispersed therein. The average particle diameter of the spherical spacers is preferably 1 to 100 μm, and more preferably 20 μm or less in consideration of the sealing performance and light transmittance. The material of the spherical spacers is not particularly limited, and examples thereof include plastic and silica. In the present embodiment, silica spherical spacers each having a particle diameter of 12 μm (trade name: HIPRESICA, coefficient of linear expansion: $5 \times 10^{-7}$ ($K^{-1}$), a product of Ube-Nitto Kasei Co., Ltd.) are used as the spherical spacers. The liquid sealing member is a liquid adhesive. In the present embodiment, the photocurable resin containing an epoxy resin (EP) as a main component (trade name: XNR5516, coefficient of linear expansion: $7 \times 10^{-5}$ ($K^{-1}$), a product of Nagase ChemteX Corporation) is used as the liquid sealing member. The spacer part 5a has a plane shape along the end on the side of the terminal region 8 on the element substrate 1a, and is disposed in the region between the element region 3 and the terminal region 8. As the liquid sealing member, a thermosetting resin other than the epoxy resin may be used, but a photocurable resin is preferably used. As a result, the curing time of the liquid sealing member can be reduced. An ultraviolet (UV) curable resin, such as an acrylic resin, under a flexible coating environment, may be used as the liquid sealing member.

According to the organic EL panel of the present invention, the spacer 5a disposed in the region between the element region 3 and the terminal region 8 can prevent deformation of the organic EL panel and prevent peeling of the sealing member 4a. As a result, the reduction in airtightness of the sealing member 4a can be suppressed, and the reliability of the organic EL panel can be enhanced. The spacer 5a is disposed only in the region between the element region 3 and the terminal region 8 and does not surround the element region 3, whereby the increase in the frame region of the organic EL panel can be suppressed.

The spacer 5a is disposed far from the sealing member 4a, and thereby a space 6 is formed between the spacer part 5a and the sealing member 4a. The space 6 is used as a buffer, whereby deformation of the organic EL panel can be prevented, and peeling of the sealing member 4a can be further prevented. As a result, the reduction in airtightness of the sealing member 4a can be more suppressed, and the reliability of the organic EL panel can be enhanced.

Use of the spacer 5a no longer needs spacers to be contained in the sealing member 4a provided on the element region 3, and therefore can easily realize the organic EL panel having a top-emission structure. In addition, the organic EL element disposed in the element region 3 by external pressing or the like is less likely to be directly damaged.

Hereinafter, the production method of the organic EL panel of Embodiment 1 will be described.

FIGS. 4(a) to 4(d) are perspective views schematically showing production steps of the organic EL panel in accordance with Embodiment 1. FIG. 5 is a plan view schematically illustrating the state before the division step of the organic EL panel in accordance with Embodiment 1.

Figure 4:
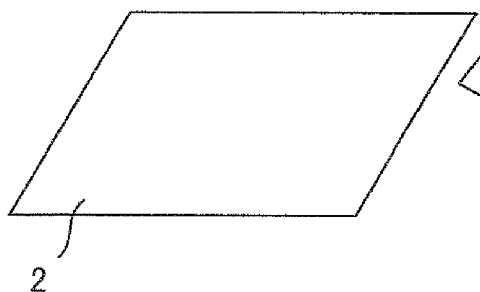
FIGS. 4(a) to 4(d) are perspective views schematically illustrating production steps of the organic EL panel in accordance with Embodiment 1.
Figure 4:
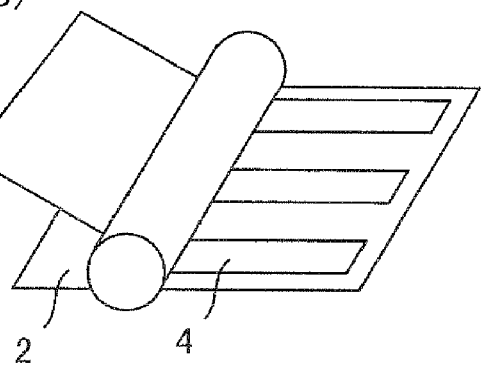
Figure 4:
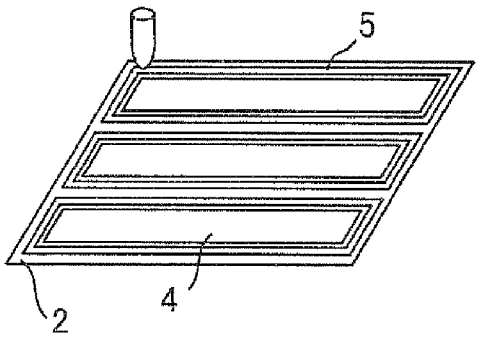
Figure 4:
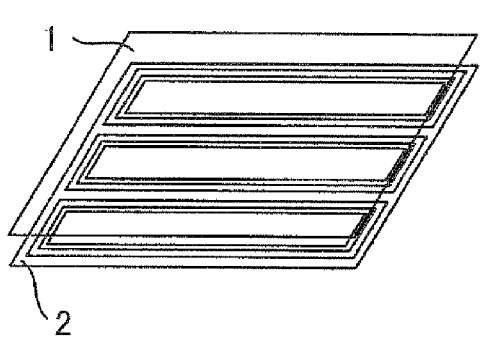
Figure 5:
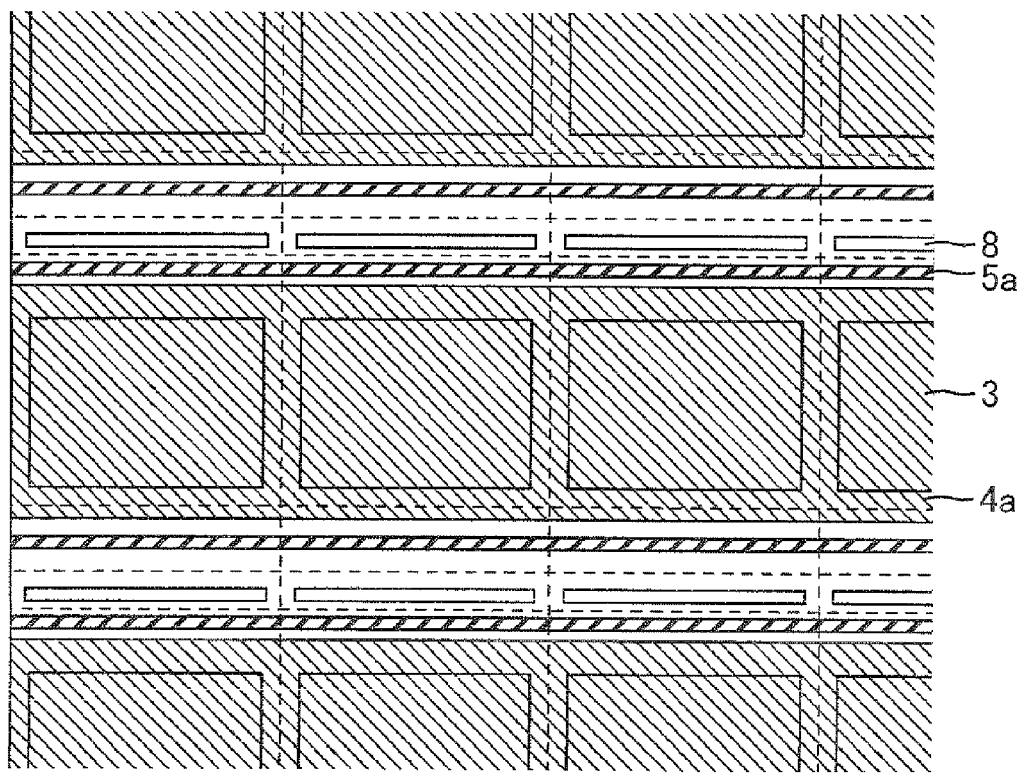
FIG. 5 is a plan view schematically illustrating the state before the division step of the organic EL panel in accordance with Embodiment 1.

As illustrated in FIG. 4(a), a sealing mother substrate 2 is prepared first. Then, as illustrated in FIG. 4(b), a plurality of sheet sealing members 4 is attached on the sealing mother substrate 2 by the roll-to-roll process (sheet sealing member-disposing step). When the sealing mother substrate 2 is attached to an element mother substrate 1 in the later step, sheet sealing members 4 is overlapped with an element region 3, not with an element region 8. Thus, when one sheet sealing member 4 is used for a plurality of element regions 3, the takt time for attaching the sheet sealing member 4 can be significantly shortened in comparison with the case where sheet sealing members 4 are respectively attached to each element region 3. In the sheet sealing member-disposing step, the sheet sealing members 4 are attached along the arrangement direction of element regions 3 adjacent to each other (in the direction substantially parallel to each other) without the terminal region 8 interposed therebetween. As a result, the sheet sealing member 4 can be easily disposed only in the necessary region, and the terminal region 8 can be prevented from being covered with the sheet sealing member 4. In addition, plural lines of sheet sealing members 4 can be simultaneously attached, and therefore the takt time for attaching the sheet sealing members 4 can be shortened.

Next, as illustrated in FIG. 4(c), a liquid sealing member 5 with spherical spacers dispersed therein is applied to the sealing mother substrate 2 (spacer-disposing step). It is preferable that prior to the spacer-disposing step, spherical spacers are uniformly dispersed in the liquid sealing member 5 and the liquid sealing member 5 in which the spherical spacers are mixed is stirred and vacuum degassed for removal of volatile components in the liquid sealing member 5. In the present embodiment, when the common sheet sealing member 4 for a plurality of element regions 3 is disposed, the takt time for applying the liquid sealing member 5 so as to surround the sheet sealing member 4 can be significantly shortened in comparison with the case where a different sheet sealing member 4 is attached to each element region 3.

In the spacer-disposing step, the liquid sealing member 5 with spherical spacers dispersed therein is applied far from the sheet sealing member 4, and a space is formed in a region between the spherical spacers and the liquid sealing member 5 and the sheet sealing member 4. By using the space, deformation of the organic EL panel can be prevented when the liquid sealing member 5 proceeds into the element region 3. This space can also be used for buffering the stress concentration and external stress in the division step. Further, in the spacer-disposing step, the liquid sealing member 5 is applied so as to surround the sheet sealing member 4. Accordingly, the liquid sealing member 5 is cured in a reduced pressure or vacuum environment before curing the sheet sealing member 4 in the later step to form the spacer part 5a, so that the region surrounded by the spacer part 5a can be kept in a reduced pressure or vacuum environment. Thereby, the sheet sealing member 4 can be cured in an air environment. In addition, in the spacer-disposing step, the liquid sealing member 5 is not disposed in the region between element regions 3 adjacent to each other without a terminal region 8 therebetween. Accordingly, the number of organic EL panels obtained by dividing the element mother substrate 1 and sealing mother substrate 2 in the later step can be increased.

Then, an element mother substrate 1 in which an organic EL element is formed in the element region 3 by a general method is prepared. Subsequently, as illustrated in FIG. 4(d), the element mother substrate 1 is attached to the sealing mother substrate 2 with the sheet sealing member 4 and the liquid sealing member 5 therebetween at normal temperatures in a vacuum or reduced pressure environment and in the presence of an inert gas such as nitrogen ($N_2$) gas and dry air, as illustrated in FIG. 4(d) (attachment step). If this step is performed in a vacuum or reduced pressure environment, the element mother substrate 1 can be attached to the sealing glass 2 without generating air bubbles inside the liquid sealing member 5 and on the contact face between the sheet sealing member 4 and the element mother substrate 1. In addition, if this step is performed at normal temperatures, a reduction in yield that might be caused by misalignment and the like can be suppressed and further, the takt time for the attachment step can be significantly shortened.

Then, in a vacuum or reduced pressure environment in the presence of an inert gas such as nitrogen ($N_2$) gas and dry air, the liquid sealing member 5 is irradiated with UV rays and cured by photopolymerization (liquid sealing member-curing step). As a result, the liquid sealing member 5 is cured to form a cured product including spherical spacers (spacer part 5a). Thus, the liquid sealing member 5 is not cured by heating, and so the takt time of the liquid sealing member-curing step can be significantly shortened without reduction in yield that might be caused by misalignment and the like. The organic EL element is vulnerable to heat, and so the absence of the heating leads to an improvement in reliability of the organic EL element. In addition, the liquid sealing member 5 is disposed so as to surround the outer periphery of the sheet sealing member 4, and the sheet sealing member 5 is cured before curing the sheet sealing member 4. As a result, the region surrounded by the spacer part 5a can be kept in a reduced pressure or vacuum environment, and therefore the sheet sealing member 4 can be cured in an air environment.

Then, the attached element mother substrate 1 and sealing mother substrate 2 are introduced in an air environment. Subsequently, the sheet sealing member 4 is heated, softened, further heated to be thermally polymerized, and thereby cured (sheet sealing member-curing step). As a result, a cured product of the sheet sealing member 4, a sealing member 4a, can be formed. When the sheet sealing member 4 is once softened and finally cured, the sheet sealing member 4 can more conform to irregularities. Accordingly, if the substrate (the element mother substrate 1 and/or the sealing mother substrate 2) is deformed when the environment under which the organic EL panel exists is changed from the vacuum or reduced pressure environment to the air environment, the sheet sealing member can follow deformation of the substrate. Therefore, generation and contamination of vacuum bubbles at the interface between the substrate and the sheet sealing member 4 can be suppressed. The coatability of irregularities of a drawing wiring with a sheet sealing member also can be further improved. In addition, when the sheet sealing member 4 is cured by thermal polymerization, degradation of the organic EL element can be prevented by light irradiation. Moreover, a moisture permeability of the sealing member 4a can be reduced, and the sealing performances of the sealing member 4a can be more improved.

When the photocurable resin having thermoplasticity is used for the sheet sealing member 4, in the sheet sealing member-curing step, the sheet sealing member 4 is heated in a vacuum or reduced pressure environment in the presence of an inert gas such as nitrogen ($N_2$) gas and dry air, softened, and thereafter cured by photopolymerization through light irradiation. In this case, degradation of the organic EL element by heating can be prevented, and the takt time of the sheet sealing member-curing step can be shortened. As in use of the thermosetting resin having thermoplasticity for the sheet sealing member 4, the moisture permeability of the sealing member 4a can be reduced, and the sealing performance of the sealing member 4a can be further improved.

Then, the attached element mother substrate 1 and sealing mother substrate 2 are divided (division step). The dotted lines in FIG. 5 show a division position (dividing line) of the organic EL panel, and the region surrounded by the dotted lines is a panel region. In the present embodiment, as illustrated in FIG. 5, the division position of three sides surrounding the element region 3 is set on the sealing member 4a, and a narrower frame region of the organic EL panel can be realized by dividing the element mother substrate 1 and the sealing mother substrate 2 together with the sealing member 4*a* at the same cutting position. Since the element region 3 is covered with the sealing member 4*a*, a cured product of the sheet sealing member 4, adhesion and barrier performance can be improved, and the adhesive strength after panel formation also can be enhanced. Therefore, even if the element mother substrate 1 and the sealing mother substrate 2 are divided together with the sealing member 4*a* at the same cutting position, the mechanical strength of the organic EL panel can be sufficiently secured. In addition, the spacer part 5*a* is not disposed between element regions 3 adjacent to each other without a terminal region 8 therebetween. Accordingly, the number of organic EL panels obtained by an element mother substrate 1 and a sealing mother substrate 2 can be increased. Further, it is needless to align the sheet sealing member 4 and the element region 3 with high precision in the attachment step, the misalignment of the sheet sealing member 4 can be reduced, leading to improvement in the yield.

Figure 6:
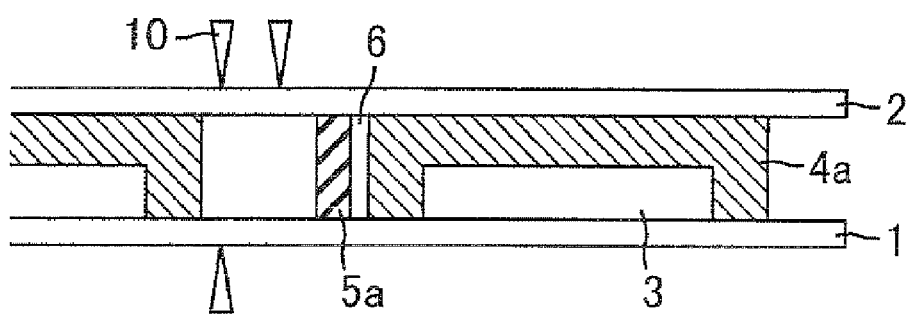
FIGS. 6(a) to 6(c) are each a cross-sectional view schematically illustrating the division step of the organic EL panel in accordance with Embodiment 1.
Figure 6:
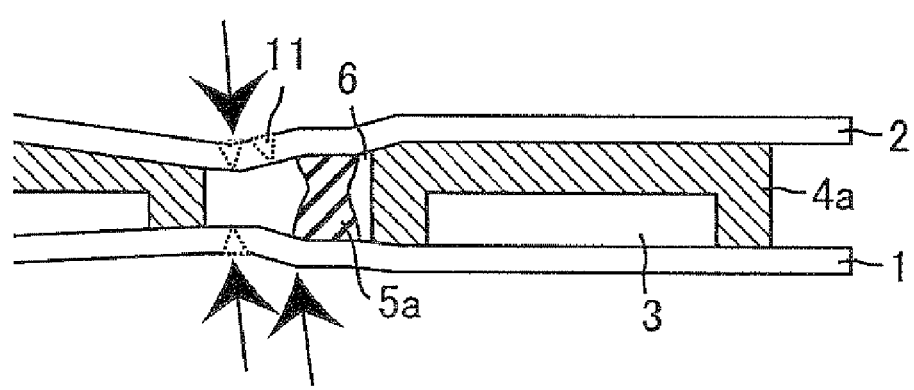
Figure 6:
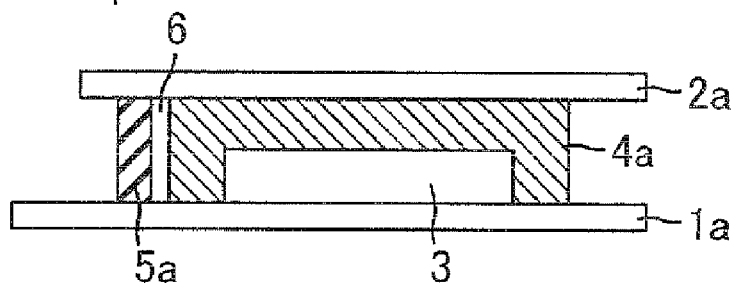

The division step will be described in detail with reference to the drawings. FIGS. 6(*a*) to 6(*c*) are each a cross-sectional view schematically illustrating the division step of the organic EL panel in accordance with Embodiment 1. FIGS. 6(*a*) to 6(*c*) each corresponds to a cross section along the lengthwise direction illustrated in FIG. 5. Accordingly, a terminal region is provided on the left side of the spacer part 5*a* in FIGS. 6(*a*) to 6(*c*). First, as illustrated in FIG. 6(*a*), a groove 11 is formed in a division position with a wheel scribe 10. In the present embodiment, Penett produced by Mitsuboshi Diamond Industrial Co., LTD. is used as the wheel scribe 10, and the indentation is 100 μm. Then, as illustrated in FIG. 6(*b*), a pressure (break pressure) is applied to a groove 11 formed at the division position, and the attached element mother substrate 1 and sealing mother substrate 2 are divided. In the present embodiment, the break pressure at the division positions of the terminal region side of the element region 3 is 7 to 9 N, and the break pressure at the division positions other than the division positions of the terminal region side of the element region 3 is 9 to 11 N. At the division positions other than the division positions of the terminal region side of the element region 3, the element mother substrate 1 and the sealing mother substrate 2 are divided together with the sealing member 4*a*, and therefore, vertical cracks such as a groove 11 are hard to form. Accordingly, it is preferable that the break pressure at the division positions other than the division positions of the terminal region side of the element region 3 is higher than the break pressure at the division positions of the terminal region side of the element region 3. The element mother substrate 1 and the sealing mother substrate 2 have the same division positions other than the division positions of the terminal region side of the element region 3. Accordingly, even if the break pressure is increased, the sealing member 4*a* is less likely to be peeled.

Figure 7:
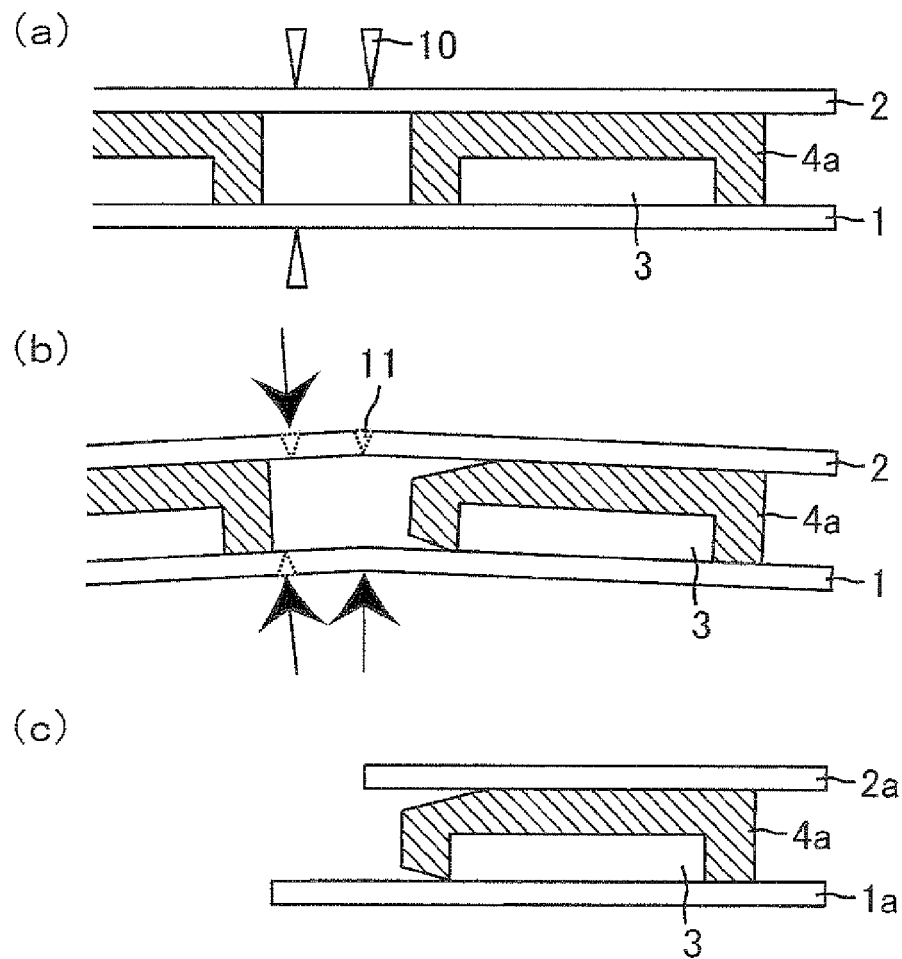
FIGS. 7(a) to 7(c) are each a cross-sectional view schematically illustrating the division step of the organic EL panel with no spacer part 5a in accordance with Embodiment 1.

It is necessary to divide the sealing mother substrate 2 in the region between the element region 3 and the terminal region and divide the element mother substrate 1 in the region opposite to the element substrate 3 with the terminal region interposed therebetween in order to easily mount electronic parts in a terminal region in the vicinity of the terminal region, so that the sealing substrate 2*a* obtained by dividing the sealing mother substrate 2 is not overlapped with the terminal region. Thus, since the element mother substrate 1 and the sealing mother substrate 2 are different in the division position in the vicinity of the terminal region, the stress concentration in the division step causes deformation of the element mother substrate 1 and the sealing mother substrate 2, leading to possible peeling of the sealing member 4*a* and possible reduction in airtightness thereof. FIGS. 7(*a*) to 7(*c*) are each a cross-sectional view schematically illustrating the division step of the organic EL panel with no spacer part 5*a* in accordance with Embodiment 1. As illustrated in FIGS. 7(*a*) to 7(*c*), a groove 11 is formed at the same division position as in FIG. 6(*a*) with a wheel scribe 10, and a pressure is applied to the groove 11. In this case, since the element mother substrate 1 and the sealing mother substrate 2 are different in the division position in the vicinity of the terminal region, as described above, the sealing member 4*a* is peeled, and the airtightness thereof is reduced. When the organic El panel of the present embodiment comprises the spacer part 5*a* disposed in the region between the terminal region and the element region 3, the above problem can be solved. Thus, as illustrated in FIG. 6(*c*), the organic EL panel can be obtained.

The space 6 formed between the spacer part 5*a* and the sealing member 4*a* acts as a buffer, and therefore can further prevent peeling of the sealing member 4*a* caused by the stress concentration and external stress in the division step. On three sides other than a side constituting the terminal region 8 side of the element region 3 in which the spacer part 5*a* is not disposed, the element mother substrate 1 and the sealing mother substrate 2 have the same division position, and therefore the sealing member 4*a* is less likely to be peeled. Accordingly, as in the organic EL panel of the present embodiment, the spacer part 5*a* can be disposed only in the necessary region, and the increase in the frame region of the organic EL panel can be suppressed.

Figure 8:
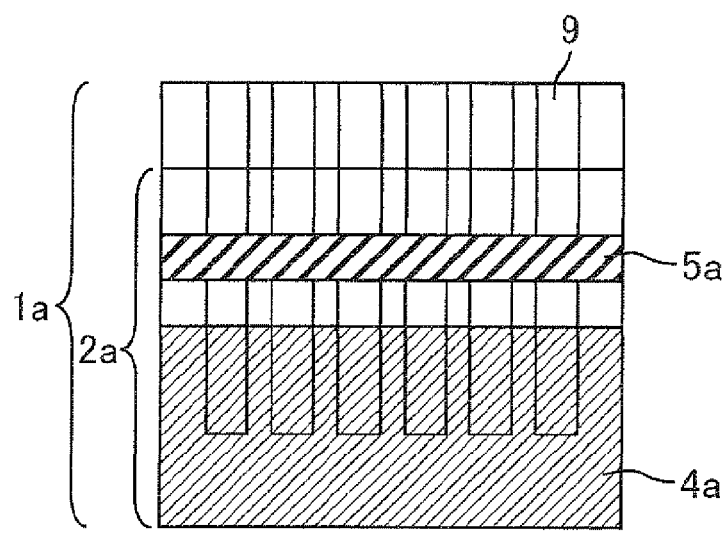
FIG. 8 is a plan view schematically illustrating the vicinity of a terminal region of the organic EL panel in accordance with Embodiment 1.
Figure 9:
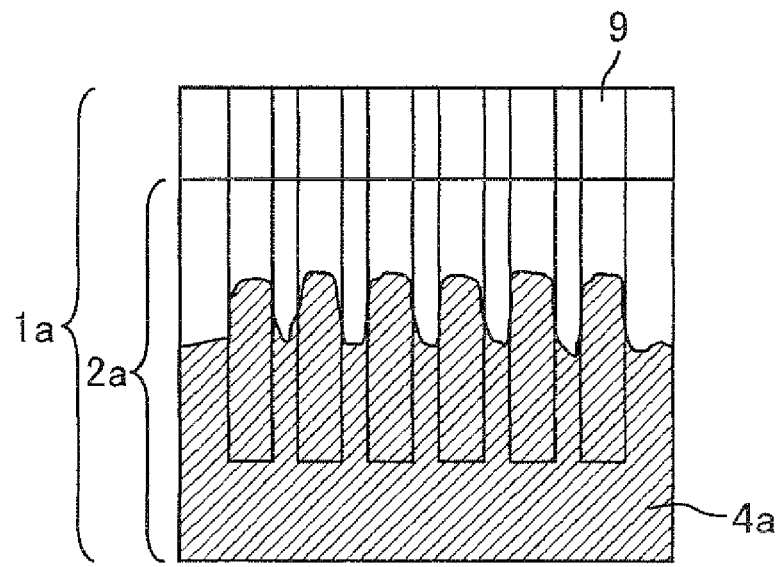

FIG. 8 is a plan view schematically illustrating the vicinity of a terminal region of the organic EL panel in accordance with Embodiment 1, and FIG. 9 is a plan view schematically illustrating the vicinity of a terminal region of the organic EL panel with no spacer part 5*a*. As illustrated in FIG. 8, the organic EL panel of the present embodiment can strictly control the thickness of the sealing member 4*a* with the spacer 5*a*. Accordingly, the coatability of irregularities of the drawing wiring (wiring part) 9 with the sealing member 4*a* can be improved, and the irregularities of the drawing wiring 9 can be completely covered with the sealing member 4*a*. In contrast, in the organic EL panel without the spacer part 5*a* as illustrated in FIG. 9, the end on the terminal region side of the sealing member 4*a* is disrupted, the irregularities of the drawing wiring 9 cannot be completely covered with the sealing member 4*a*, and the airtightness of the sealing member 4*a* my be reduced. Thus, with use of the spacer part 5*a*, the coatability of the irregularities of the drawing wiring 9 with the sealing member 4*a* can be improved, and the reliability of the organic EL panel can be enhanced.

Hereinafter, a modified embodiment of Embodiment 1 will be described.

Figure 10:
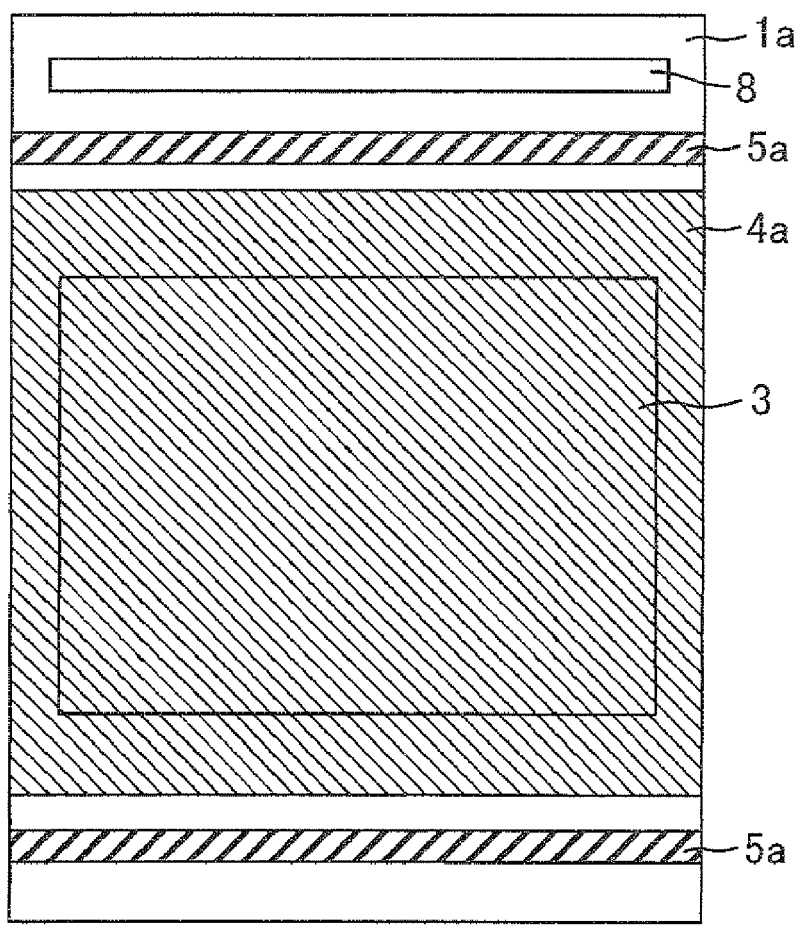
FIG. 10 is a plan view schematically illustrating another organic EL panel in accordance with Embodiment 1.

FIG. 10 is a plan view schematically illustrating another organic EL panel in accordance with Embodiment 1. In the organic EL panel of the present embodiment as illustrated in FIG. 10, the spacer part 5*a* may be disposed in the region between the element region 3 and the terminal region 8 and in the region opposite to the terminal region 8 with the element region 3 interposed therebetween. In this case, the spacer part 5*a* disposed in the region between the element region 3 and the terminal region 8 functions as the first spacer, and the spacer part 5*a* disposed in the region opposite to the terminal region 8 with the element region 3 interposed therebetween functions as the second spacer. Such an organic EL panel can be produced by changing the division position of the region opposite to the terminal region 8 with the element region 3 interposed therebetween and performing the division step.

Thus, the spacer part 5*a* is disposed in the region between the element region 3 and the terminal region 8 and in the region opposite to the terminal region 8 with the element region 3 interposed therebetween, whereby deformation of the organic EL panel caused by external stress such as change in environmental temperature can be more prevented, and peeling of the sealing member 4a can be more prevented. As a result, the reduction in airtightness of the sealing member 4a can be further suppressed. In addition, since the thickness of the sealing member 4a can be more strictly prevented, the coatability of the irregularities of the drawing wiring connected to the organic EL element with the sealing member 4a can be further improved, and the reduction in airtightness of the sealing member resulting from the irregularities of the drawing wiring can be more suppressed. Thus, the reliability of the organic EL panel can be enhanced.

The first spacer and the second spacer may be made of different materials but preferably the same material. As a result, only by changing the division position, the spacer part 5a can be easily disposed in the region between the element region 3 and the terminal region 8 and in the region opposite to the terminal region 8 with the element region 3 interposed therebetween, as illustrated in FIG. 10. Therefore, the production process of the organic EL panel provided with the first and second spacers can be simplified.

As thus described, since the organic EL panel of the present embodiment can maintain can maintain stable emission properties for a long period of time, the organic EL display and the organic EL lighting device can be suitably used.

The present application claims priority to Patent Application No. 2008-223240 filed in Japan on Sep. 1, 2008 under the Paris Convention and provisions of national law in a designated State, the entire contents of which are hereby incorporated by reference.

EXPLANATION OF NUMERALS AND SYMBOLS

1: Element mother substrate
1a: Element substrate
2: Sealing mother substrate
2a: Sealing substrate
3: Element region
4: Sheet sealing material
4a: Sealing member (cured product of sheet sealing material)
5: Liquid sealing material
5a: Spacer part (cured product of sheet sealing material with spherical spacers dispersed therein)
6: Space
8: Terminal region
9: Drawing wiring (wiring part)
10: Wheel scribe
11: Groove

The invention claimed is:

1. An organic electroluminescent panel, comprising:
an element substrate in which an organic electroluminescent element and a terminal region are formed;
a sealing member that covers the organic electroluminescent element;
a sealing substrate attached to the element substrate with the sealing member interposed therebetween; and
a first spacer disposed only in a region between the organic electroluminescent element and the terminal region, wherein
the first spacer is disposed away from the sealing member, and wherein
no spacer is arranged on at least one side of outline of a region where the organic electroluminescent element is provided.

2. The organic electroluminescent panel according to claim 1,
wherein the sealing substrate is not overlapped with the terminal region.

3. The organic electroluminescent panel according to claim 1,
wherein the first spacer includes spherical spacers dispersed in resin.

4. The organic electroluminescent panel according to claim 3,
wherein the resin is a photocurable resin.

5. The organic electroluminescent panel according to claim 1,
wherein the sealing member includes a thermocurable resin.

6. The organic electroluminescent panel according to claim 1,
wherein the sealing member has a thickness of 1 to 100 μm.

7. The organic electroluminescent panel according to claim 1,
wherein the sealing member has a light transmittance of 80% or more in a visible wavelength range.

8. The organic electroluminescent panel according to claim 1,
wherein a difference in linear expansion coefficient between the first spacer and the sealing member is $1.0 \times 10^{-4} (K^{-1})$ or less.

9. The organic electroluminescent panel according to claim 1,
wherein a difference in linear expansion coefficient between the first spacer, the sealing member, the element substrate, and the sealing substrate is $1.0 \times 10^{-4} (K^{-1})$ or less.

10. The organic electroluminescent panel according to claim 1, further comprising:
a second spacer disposed only in a region opposite to the terminal region with the organic electroluminescent element interposed therebetween.

11. The organic electroluminescent panel according to claim 10,
wherein the first spacer and the second spacer are made of the same material.

12. The organic electroluminescent panel according to claim 1,
wherein the organic electroluminescent panel has a top-emission structure.

13. An organic electroluminescent display comprising:
the organic electroluminescent panel according to claim 1.

14. An organic electroluminescent lighting device comprising:
the organic electroluminescent panel according to claim 1.

15. A production method of an organic electroluminescent panel by using an element mother substrate provided with a plurality of panel regions in each of which an organic electroluminescent element and a terminal region are formed, the method comprising the steps of:
disposing a sheet sealing member so as not to cover the terminal region and so as to cover the organic electroluminescent element;
disposing a spacer at least in a region between the organic electroluminescent element and the terminal region;
attaching the element mother substrate and a sealing mother substrate; and
dividing the element mother substrate and the sealing mother substrate together with the sheet sealing member at a same cutting position, wherein in the spacer-disposing step, the spacer is disposed away from the sheet sealing member, and wherein no spacer is arranged on at least one side of outline of a region where the organic electroluminescent element is provided.

16. The production method of the organic electroluminescent panel, according to claim 15, wherein in the division step, the sealing mother substrate is divided in the region between the organic electroluminescent element and the terminal region, and the element mother substrate is divided in a region opposite to the organic electroluminescent element with the terminal region interposed therebetween.

17. The production method of the organic electroluminescent panel, according to claim 15, wherein in the division step, the element mother substrate and the sealing mother substrate are divided so that the spacer remains only in the region between the organic electroluminescent element and the terminal region.

18. The production method of the organic electroluminescent panel, according to claim 15, wherein in the division step, the element mother substrate and the sealing mother substrate are divided so that the spacer remains only in the region between the organic electroluminescent element and the terminal region and in a region opposite to the terminal region with the organic electroluminescent element interposed therebetween.

19. The production method of the organic electroluminescent panel, according to claim 15, wherein in the sheet sealing member-disposing step, the sheet sealing member is disposed to continuously cover the organic electroluminescent elements adjacent to each other without the terminal region interposed therebetween.

20. The production method of the organic electroluminescent panel, according to claim 19, wherein in the sheet sealing member-disposing step, the sheet sealing member is disposed along the arrangement direction of the organic electroluminescent elements adjacent to each other without the terminal region interposed therebetween.

21. The production method of the organic electroluminescent panel, according to claim 15, wherein in the spacer-disposing step, the spacer is disposed so as to surround a region in which the sheet sealing member is disposed.

22. The production method of the organic electroluminescent panel, according to claim 15, wherein the spacer includes spherical spacers, and in the spacer-disposing step, a liquid sealing member with the spherical spacers dispersed therein is disposed so as to surround a region in which the sheet sealing member is disposed.

23. The production method of the organic electroluminescent panel, according to claim 22, wherein in the spacer-disposing step, the spherical spacers and the liquid sealing member are disposed away from the sheet sealing member.

24. The production method of the organic electroluminescent panel, according to claim 22, wherein the liquid sealing member includes a photocurable resin.

25. The production method of the organic electroluminescent panel, according to claim 15, the method further comprising:

a step in which the sheet sealing member is softened and then cured.

26. The production method of the organic electroluminescent panel, according to claim 25, wherein the sheet sealing member has thermoplasticity.

27. The production method of the organic electroluminescent panel, according to claim 15, wherein the sheet sealing member is cured by polymerization.

28. The production method of the organic electroluminescent panel, according to claim 27, wherein the polymerization is photopolymerization or thermopolymerization.

29. The production method of the organic electroluminescent panel, according to claim 15, wherein a cured product of the sheet sealing member has a light transmittance of 80% or more in a visible wavelength range.

30. A production method of an organic electroluminescent display, comprising:

the production method of the organic electroluminescent panel according to claim 15.

31. A production method of an organic electroluminescent lighting device, comprising:

the production method of the organic electroluminescent panel according to claim 15.

* * * * *